United States Patent [19]

Saxena

[11] 4,436,582

[45] Mar. 13, 1984

[54] MULTILEVEL METALLIZATION PROCESS FOR INTEGRATED CIRCUITS

[76] Inventor: Arjun N. Saxena, 4217 Pomona Ave., Palo Alto, Calif. 94306

[21] Appl. No.: 201,109

[22] Filed: Oct. 28, 1980

[51] Int. Cl.³ .............................................. C23F 1/02
[52] U.S. Cl. .................................... 156/656; 29/590; 29/591; 156/657; 357/71
[58] Field of Search ................... 156/656, 657; 29/590, 29/591; 357/71

[56] References Cited
U.S. PATENT DOCUMENTS 4,078,963  3/1978  Symersky ........................ 156/656

Primary Examiner—Bruce H. Hess
Attorney, Agent, or Firm—John L. McGannon

[57] ABSTRACT

A multilevel metallization process which allows fabrication of several types of high density MOS and bipolar integrated circuits. The process uses a pad located under the inter-layer contact opening. The material of the pad is poly-silicon (doped or undoped), a refractory metal, or a refractory metal silicide which is not capable of being attacked during chemical etching of the metallization layers. If poly-silicon is used, it is either doped during its deposition or during contact doping, or it is automatically silicided during ohmic and Schottky contact formations.

6 Claims, 6 Drawing Figures

MULTILEVEL METALLIZATION PROCESS FOR INTEGRATED CIRCUITS

FIELD OF INVENTION

The present invention relates to an improved multilevel metallization process which allows interconnections between various devices and different parts of an integrated circuit using more than one level of interconnections. More particularly, the invention involves a process for aiding the fabrication of high density MOS, bipolar and Schottky-bipolar integrated circuits by using multilevel interconnections between various parts of the integrated circuit within a chip.

DESCRIPTION OF THE PRIOR ART

It is well known that an integrated circuit consists of various active devices, for example, transistors and diodes, and various passive devices, for instance, resistors, capacitors and fuses. Depending upon the design of the integrated circuit, the active and passive devices need to be interconnected in a given manner to perform a desired circuit function. The number of devices and interconnections within an integrated circuit chip are usually much larger than the number of input-output connections on the chip. This requires that many interconnections within the chip be done with one or more levels of metallization.

Early versions of integrated ciruicit chips had only one level of metallization. For example, after the fabrication of various types of active and passive devices is completed, a contact mask is applied by using conventional photolithographic technology. After etching the various contacts to the various devices, ohmic, Schottky, barrier and interconnect metallization processes are done. Typical metals used in a bipolar integrated circuit are Pt(PtSi), TiW and Al (and other alloys of Al such as Al-Cu, Al-Si, Al-Si-Cu).

Patterns are next etched in the metallization layer using photolithographic processes to interconnect various regions of the chip and to the metal bonding pads for connection to the outside world of the chip. Typical numbers of interconnection within a chip can range from a few hundred to many thousands; whereas, the number of the bonding pads can range from 10 to 60. Thus, intricate metallization patterns with long and zig-zag metal lines are required in the one level metallization case to interconnect various regions in the chip and to avoid shorting of various regions. The fact that these metal lines are long and have many bends requires that the metal lines be wide to lower their series resistance so that the current densities through them will be lower than the threshhold for electromigration. Further, these metal lines need to be spaced apart by a reasonable distance determined by the type of technology used.

In summary, the one-level metallization case gives rise to the following problems:
1. The chips are large in size due to very long and zig-zag metal lines.
2. The yields of such chips are low because of broken metal lines, bridging between metal lines and shorting between metal lines and the substrate through unwanted pinholes in the dielectric layer.
3. Many circuit functions cannot be obtained because it is not possible to hop across a metal line in the one-level metallization case. Cross-unders are sometimes used but provide only a partial solution to the limitations of this case.

Because of the foregoing limitations, multilevel metallization processes are needed.

The most widely used multilevel metallization process now used is a two-level metallization process. The two layers or levels are of aluminum and its alloys with copper and silicon. These are predominantly used because their deposition, masking, etching, contact metallurgy and associated properties are better understood than other metals and alloys which are still under evaluation for large scale use in integrated circuit technology. Other metals and alloys are expected to replace aluminum as the dominant interconnect material because of its several limitations. The use of aluminum is restricted to one or two-level metallization technologies at present. Its use in a three or four or higher level metallization technique has been precluded so far. And object of the present invention is to provide a technique which enables aluminum and its alloys to be used not only in a two-level metallization process but a three, four or higher level metallization which has not been possible, thus far.

FIG. 1 illustrates in block form the process flow of a typical, state of the art two-level metallizaton process using aluminum and/or its alloys in a bipolar process. The arguments discussed below for the bipolar process will apply for the MOS process although aluminum is not as widely used in this latter process as in the bipolar process.

The problems encountered in the conventional technology shown in FIG. 1 are as follows:
1. The first and second masks have oversized region around the vias. This limits the packing density of both the first and second metal lines. FIG. 2a shows a typical case for no adjacent vias as practice for typical design rules used in the industry. FIG. 2b shows the new desired situation which is attainable with the present invention. Similarly, FIGS. 3a and 3b show corresponding old and new situations for the typical case of adjacent vias.
2. Via etching attacks $SiO_2$ under the first aluminum layer through pinholes and defects and undercuts the first aluminum layer when misalignment occurs.
3. Etching of second layer aluminum attacks first layer aluminum and causes opens when misalignment occurs, especially when TiW is not used under the second layer of aluminum.
4. Wet chemical etch or sputter etch of vias prior to second layer aluminum or TiW-Al deposition may remove first layer aluminum from vias in an erratiac way and cause poor contact with the second layer aluminum.
5. Re-work of second layer aluminum is not possible, generally speaking, because etching it also removes the first layer aluminum from the contact areas.

The foregoing problems have plagued the integrated circuit industry for over a decade or more. These problems not only prevent the size reduction of integrated circuit chips but also contribute to the severe loss of yield of integrated circuits.

SUMMARY OF THE INVENTION

The present invention relates to an improved multilevel metallization process which can be used either with the presently known aluminum metallization technology or with newer refractory metals and compounds for both bipolar and MOS integrated circuits. The important aspects of the present invention include the following:

1. The process of this invention uses pads of one or more materials to be deposited on the insulating layer of the integrated circuit before the conventional contact mask is used to open the contacts to the active and passive devices.
2. The locations of these pads are under the via areas needed for contacting the first or lower layer with the second or next upper layer of the metal.
3. The material suitable for these pads can be selected from those materials which have good electrical conductivity and are compatible with various integrated circuit processes. Such materials include poly-silicon, doped polysilicon, refractory metal silicide or refractory or other metals, such as Ti or Pt. The materials should not be chemically attacked appreciably by the etchants used to etch the two metallization layers.
4. The physical sizes of these pads are larger than the via contact size by an amount determined by the alignment and the etching design rules.
5. A reverse field oversized via mask, hereinafter referred to an ROV mask, is used.
6. The first and second layer metal masks do not have oversized regions, thereby allowing closer spacing between adjacent metal lines. Thus, the integrated circuit chips can be made smaller with higher yields.
7. The process of the present invention, while it could be used with a conventional doped vapox as the inter-metal dielectric, uses one or more of the following improved intermetal dielectrics:
   a. The dielectric on top of the first metallization layer can be a doped and graded vapox such that the etch rate of the vapox in contact near the first metal is lower than the upper part of the vapox and the etchant used for via etching. For example, a simple case is to use an undoped vapox layer first on the top of which a doped vapox layer is deposited. In HF based etches, the etch rate of the doped vapox is higher than that of the undoped vapox. This simple two-layer vapox may be used in lieu of a graded doped vapox so that undercutting during via etching to give a reverse slope at the via contact is avoided.
   b. The dielectric can be formed by first depositing a thin layer of silicon nitride after the first metal pattern delineation. Its thickness could be in the range of 500-1,000 Å. Next, doped vapox (7,000-10,000 Å) is deposited. Such a structure will eliminate the reverse slope at the via contact etching, except that this method requires vapox etching first and then the silicon nitride etching.
8. The process of the present invention can be used with the widely used aluminum metallization technology to reduce chip size and enhance the yield and performance of the integrated circuits. In a two-level metallization case, additional steps needed in the present invention as compared to the conventional technology include deposition of the material for pads before contacts are opened and an extra mask (ROV) to delineate these pads.

It is an object of the present invention to provide an improved process for achieving two-level metallization interconnects in integrated circuits.

Another object of the present invention is to provide an improved process for achieving two-level aluminum metallization interconnects in integrated circuits in which the dominant aluminum metallurgy and processing now widely used in the industry is employed without substituting new materials for aluminum as the main conductor of electrical signals.

Another object of the present invention is to provide an improved process of the type described which allows closer spacing between the various metal interconnect lines in a given level of metallization so that the overall size of the integrated circuit chips can be small, resulting in higher yields and improved performance.

Another obejct of the present invention is to provide a process of the aforesaid character wherein the reworking of the second layer metal which may be needed due to a variety of reasons to salvage and recover the integrated circuits on a wafer at a stage of processing when the wafer costs are very high.

Still another object of the present invention is to provide a process of the type described which eliminates the etching of the dielectric layer underneath and around the first layer metal during the etching of the inter-metal dielectric in the vias.

Another object of the present invention is to provide a process of the type described in which pads under the first layer metal under the vias are automatically silicided in one of the preferred embodiments having high electrical conductivity and chemical resistance to the etchants used for dielectrics and metals.

A further object of the present invention is to provide an improved process to achieve multilevel metallization interconnects in bipolar and MOS integrated circuits.

Other objects of the present invention will become apparent as the following specification progresses, reference being had to the accompanying drawings for an illustration of a prior art process and the process of the present invention.

IN THE DRAWINGS

DESCRIPTION OF THE PREFERRED EMBODIMENTS

To appreciate the key features of the process of the present invention, the conventional prior art two-level metallization process with aluminum will be discussed with respect to FIG. 1. For purposes of illustration, a Schottky bipolar process is chosen and the previous processes performed on the wafers up to emitter diffusion and oxidation are assumed to be well known. This is the first step in FIG. 1. The next step is to apply the conventional contact mask to open contacts to various devices and Schottky regions. The next step consists of sputter-etching of these contacts and deposition of metals or alloys, such as Pt, Pd or PtNi. The choice of these metals or alloys lies in selecting the one which gives the desired barrier height in the Schottky region, and a reliable, good ohmic contact to the other regions after the fourth step to form the metal silicide. The unreacted metal is etched selectively without attacking the silicide formed by sintering. The next steps of TiW deposition and Al or Al-Cu depositions are carried out sequentially in one deposition system, preferably without exposing the TiW surface to ambient temperature prior to Al or Al-Cu deposition. When such a deposition system with dual targets is not available, TiW and Al are deposited in two separate systems.

Figure 2B:
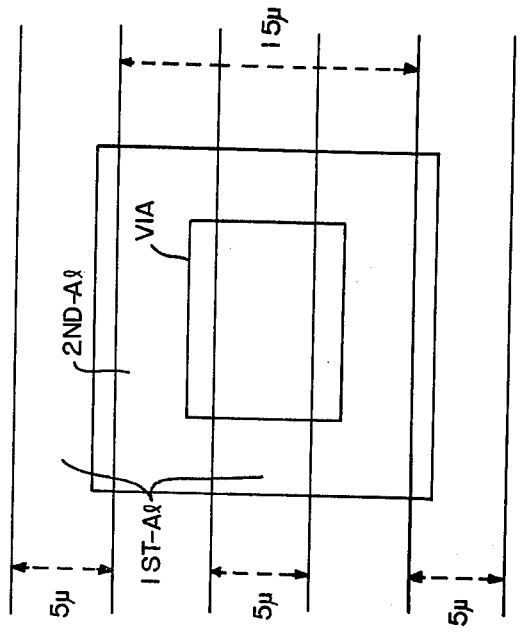
FIG. 2b is a view similar to FIG. 2a but showing a new layout which is possible with the process of the present invention without changing any other design rules, the spacing of the first layer metal being capable of shrinking to 15μ.
Figure 2A:
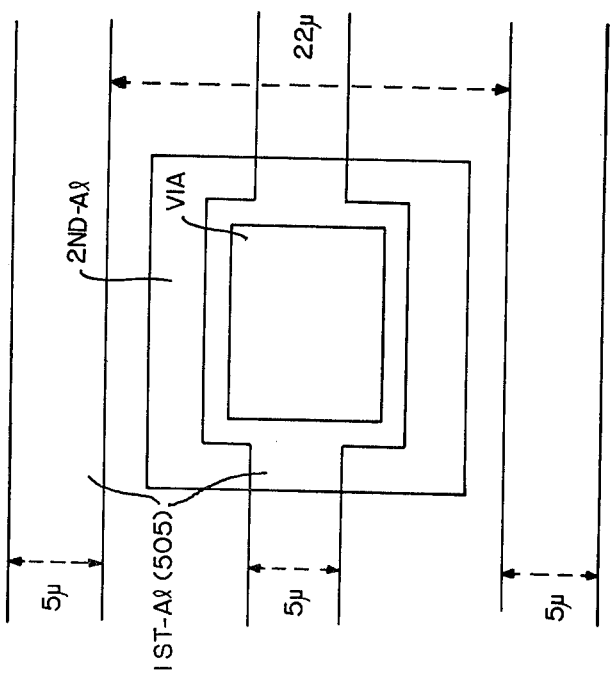
FIG. 2a shows a typical example of a prior art layout in which the first and second metal lines have no adjacent vias, showing a bulge of central first layer metal line which makes the spacing between adjacent first layer aluminum on either side of the via to be 22μ for the design rules under consideration.
Figure 3B:
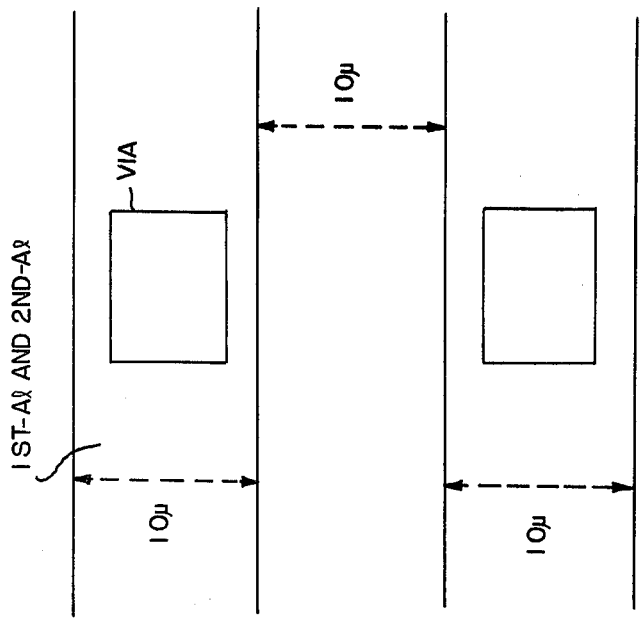
FIG. 3b is a view similar to FIG. 3a but showing the new layout possible with the present invention for the first and second metal lines with adjacent vias without changing any other design rules.
Figure 3A:
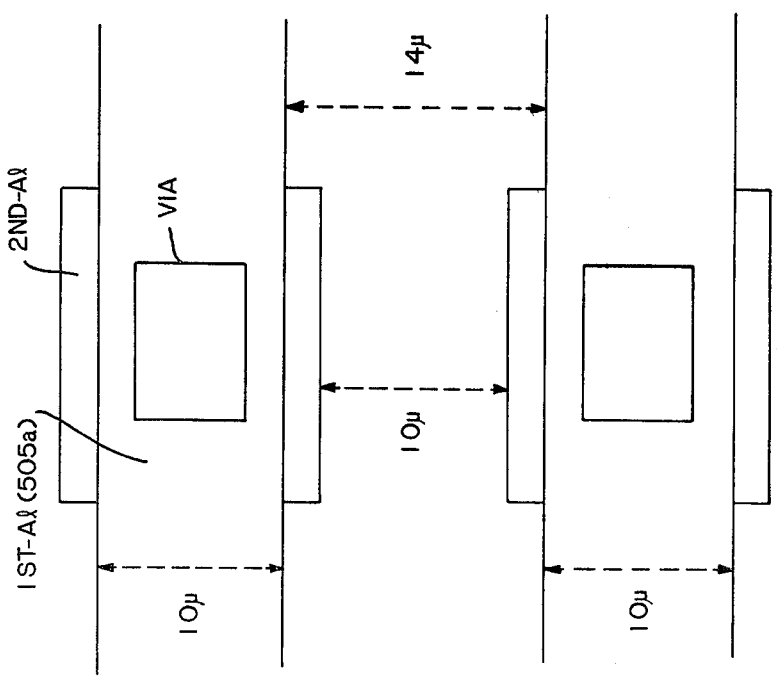
FIG. 3a shows a typical example of a prior art layout for the first and second metal lines with adjacent vias.

The first metal mask is applied in step 7 with conventional photolithographic techniques. Depending upon the design rules used, the first metal interconnect lines are either narrow with oversized regions where vias are to be etched for contact to the first metal layer 505 (see FIG. 2a), or the entire first metal lines are wide 505a (see FIG. 3a). Specific dimensions for a typical case are shown in FIGS. 2a and 3a. Such oversized regions in the first metal layer are needed so that, when the vias are aligned and etched over these regions, the misalignment errors would still keep the vias over the first metal layer. Thus, the etching of the oxide underneath would be prevented. Because of this necessity of oversized regions in the first metal layer, the packing density of the metal lines is limited and the chip size cannot be reduced. Etching of Al and TiW in steps 8 and 9 is done by wet chemical etching. Improved TiW etching can be done by plasma etching following the process described in U.S. Pat. No. 4,057,460 of Arjun N. Saxena.

Phosphorus doped vapox (concentration of phosporus in SiO$_2$ being about 5%-8% by weight) of thickness 7,000-10,000 Å is next deposited in step 10. The disadvantange of such a uniform of doped vapox is that its etch rate is constant. A via mask is applied in step 11 and aligned carefully to center it in the metal pad regions in the first Al layer. When it is misaligned, it will expose the underlying SiO$_2$ during via etching which would then create problems.

Figure 5:
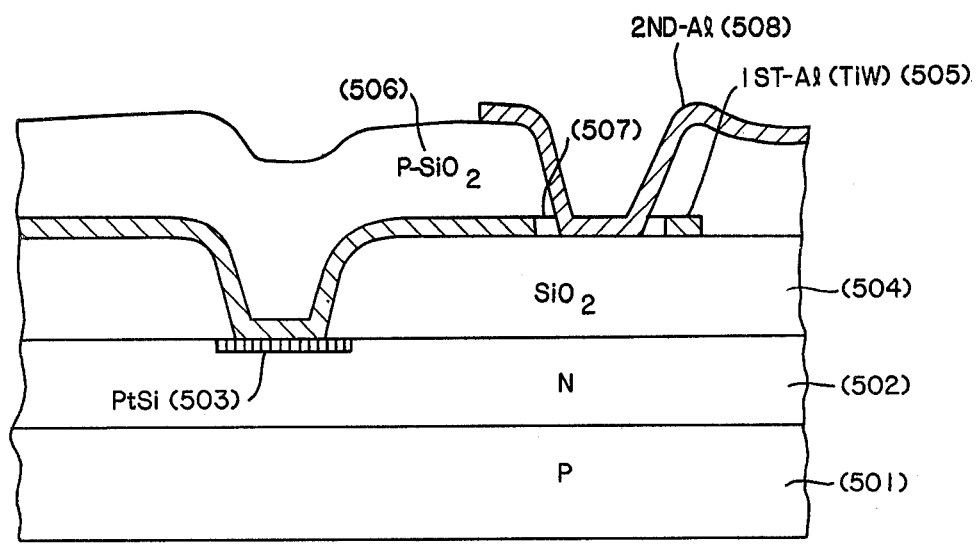
FIG. 5 is a vertical section of a typical case of open or no contact between second layer aluminum and first layer aluminum in prior art technology.

Vias are etched in step 12. As the bottom of the via and the top surface of the first layer aluminum are approached during etching, ocasionally a reverse slope of the bottom contact of the via is encountered. This is due to the fact that the etch rate of the uniformly doped vapox is constant throughout, except that a slight enhancement of the etch rate occurs as the etchant reaches the Al surface. This effect is somewhat erratic. However, when such an effect is present, metal step coverage problems arise. I The next step is to deposit pure Al as in step 13a or to deposit TiW and Al as in step 13b for the second layer 508. The latter is preferable. The second metal mask is applied in step 14 and the etching is done either according to step 15a or 15b. Should a re-work of the second layer be needed, the etching of the second layer 508 etches off the metal in the first.layer 505 in the vias. If this problem is not detected, and a second layer is deposited again, the contact of the second layer to the first layer in the vias is lost either completely or partially in an erratic manner. An example of no-contact between second Al and first Al is shown in the cross section in a structure in FIG. 5. Creation of the gap 507 due to over-etching during re-work procedure causes the no-contact situation.

Figure 4:
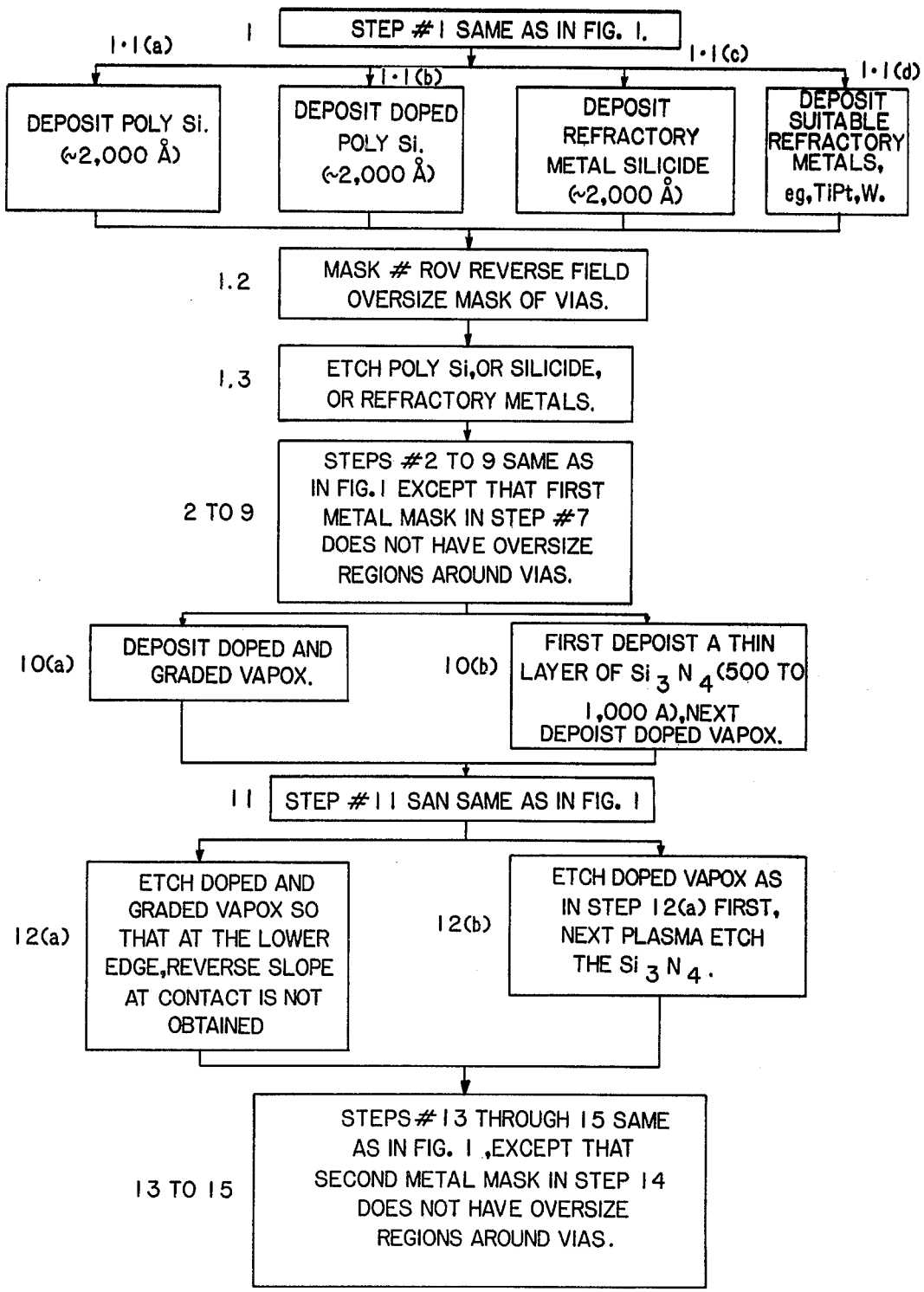
FIG. 4 is a block diagram of the two-level metallization process of the present invention when using aluminum.

In the present invention, the process flow is shown in FIG. 4. It gives the new two-level metallization process with Al, and it can also be applied to multilevel metallization processes. In FIG. 4, the numbering of various process steps which are similar to those of the prior art shown in FIG. 1 are kept unchanged, except that the additional steps in FIG. 4 are inserted and numbered as n.m. Variable "n" refers to the previous process step number after which the additional steps are introduced, and the variable "m" refer to subclassification of the process step.

Step 1.1, before contacts are etched to Si, is one of the key parts of the present invention: Deposition of a material having inherently good electrical conductivity or which becomes a good electrical conductor automatically during subsequent processing. Also, such a material, which forms a pad 609 (FIG. 6) either should be chemically inert to, or not attacked by, the etching chemical and process of the metals used for interconnects and for the vias etching. A choice of such a material can be one of the following:

1.1a. Poly Si of thickness, for example, of 2,000 Å. Its surface will get converted to a good electrical conductor automatically in subsequent processing of silicides for ohmic contacts and Schottky barriers.

1.1b. Doped poly Si, for example, with phosporus, of thickness typically around 2,000 Å. Its surface will get converted to a good electrical conductor automatically in subsquent processing of silicides of ohmic contacts and Schottky barriers.

1.1c. Refractory metal silicide, for example, WSi$_2$ of thickness around 2,000 Å.

1.1d. A refractory or another metal like Pt of thickness about 1,000 Å. It is well known that, for its adhesion to the SiO$_2$ surface, a Ti layer of thickness around 500 Å needs to be deposited first on top of which the Pt layer is deposited. Other refractory metals like W may be used on second interconnect layers and upper layers. Pt is preferred for the first interconnect layer because in subsequent processing of PtSi contacts, it does not introduce any new metal contamination.

The choice of the material is not limited to the above four types. The first three types are easier to use in the present invention as compared to the fourth such as TiPt. This is because etching patterns in Pt is difficult, on a relative basis, and it requires sputter-etching, as in beamlead technology or lift-off techniques. However, when a metal, like W, is used on second and upper interconnect layers, its etching is no problem.

Next, in step 1.2, mask ROV, which is the reverse field oversize mask of the vias, is applied, which covers the pads 609 of one of the materials 1.1a, 1.1b, 1.1c or 1.1d. The physical size of these pads 609 is larger than the via size by an amount determined by the alignment and the etching design rules. Typical oversize of such pads as compared to vias is about 2-4$\mu$ all around. Uneven oversizing of these pads can be done depending upon the location of adjacent vias and metal lines.

In step 1.3, etching of the material used in this invention is done either by using wet chemical techniques or by plasma for the materials of types 1.1a, 1.1b or 1.1c. Typical wet chemical etching solutions use various proportions of HF: $HNO_3$: and $H_2O$ depending upon the etch rate desired. Typical gas mixtures used in plasma etching are ($CF_4+4\%O_2$) or other combinations with $CF_4$. If Pt is used at step 1.1d, sputter-etching or lift-off techniques need to be used. If W is used at 1.1d, either wet chemical $H_2O_2$ etching or plasma etching with $CF_4+4\%O_2$ is done.

Figure 1:
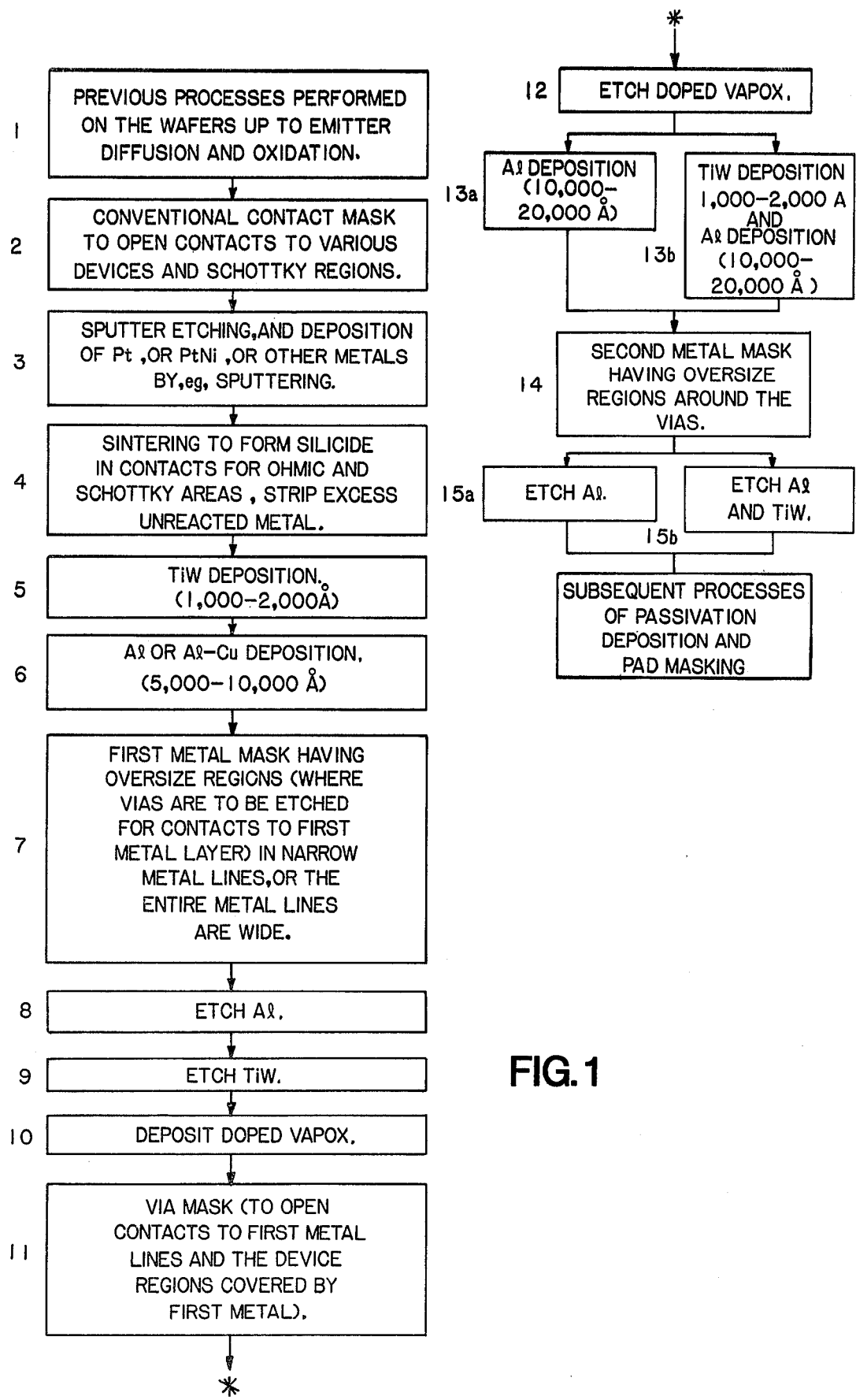
FIG. 1 is a block diagram of a conventional, two-level metallization process with aluminum involving a Schottky bipolar process.

Steps 2-9 are the same in FIG. 4 as in FIG. 1 except that the first metal mask in step 7 does not have oversized regions around vias. The next step of depositing interlayer dielectric can be done either in the conventional way as in step 10 of FIG. 1 or one of the following 2 ways for improved etching of vias:

10a. Deposit a doped and graded vapox such that the etch rate of the vapox in contact and near the first metal is lower than the upper part of the vapox in the etchant used for via etching. A simple case will be to use an undoped vapox layer, about 1,000-2,000 Å thick, to be deposited first, and to deposit a doped vapox (5%-8% by weight of phosphorus in $SiO_2$) about 6,000-10,000 Å thick. The etch rate of the doped vapox is much higher than that of the undoped vapox in HF based etches. Thus, undercutting during via etching to give a reverse slope at the via contact is avoided.

10b. Deposit a thin layer of $Si_3N_4$, after the first metal pattern delineation, about 500-1,000 Å thick. Next, deposit doped vapox about 7,000-10,000 Å thick. Such a structure will also eliminate the reverse slope at the via contact etching. Other variations of this structure are possible, for example, deposit a thin layer of undoped vapox first, next the $Si_3N_4$, and then the doped vapox.

Via mask in step 11 is the same as in FIG. 1. The etching of vias as in step 12a is the same as in step 12 in FIG. 1, except that, due to undoped or graded vapox with lower phosphorus doping in the lower portion, reverse slopes at contact are not obtained. In the case of step 12b, the doped vapox is etched as in step 12 of FIG. 1 and then plasma etching at $Si_3N_4$ is done to open the via contacts to the first metal. Additional masking steps may be required when contact to Si by the second metal is needed.

Figure 6:
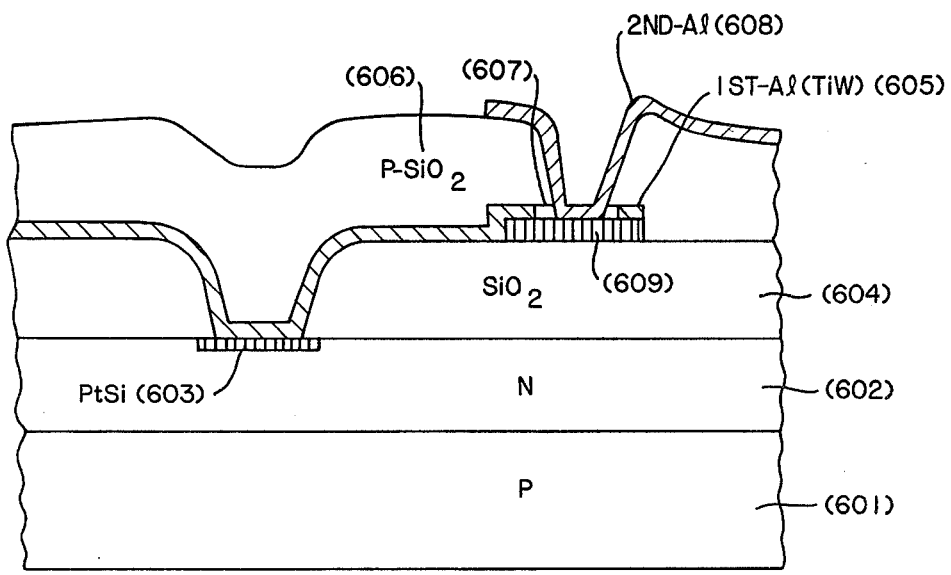
FIG. 6 is a view similar to FIG. 5 but showing an integrated circuit which allows contact between second layer aluminum and first layer aluminum as provided by the process of the present invention.

The subsequent steps 13-15 are the same as those in FIG. 1 except that the second metal mask in step 14 does not have oversized regions around vias. If the first metal is exposed during the second metal etching, the exposed portion of the first metal will be etched off. However, the electrical continuity between the second and the first metals will be maintained not only due to the overlapping second and first metals in the vias, but also due to the conducting pad underneath which is not affected by the metal etching. This same situation exists even during the re-work of the second metal which etches off the first metal from the vias. In this case also, the electrical continuity between the second and first metals is maintained due to the conducting pad underneath the via. This is one of the key features of the present invention and is shown in FIG. 6. The pad material 609 in FIG. 6 maintains the electrical continuity between the first layer metal 605 and the second layer metal 608 without introducing appreciable resistance.

For multilevel interconnections involving more than two metal layers, the pad materials 1.1c and 1.1d are to be used on second layer onward. This is so because in such a case the poly Si deposited in types 1.1a or 1.1b will not automatically get silicided because the ohmic contacts and Schottky regions will already have undergone siliciding and be covered by the first layer metal.

The present invention can be embodied in other forms without departing from the spirit of the invention itself. The invention is not to be limited to the specific combinations of materials discussed herein but limited only by the appended claims. A wide variety of materials with different etch properties and electrical conductivities can be used. Thus, the present embodiments are to be considered illustrative and not restrictive.

What is claimed is:

1. A process for fabricating electrical connections on an integrated circuit structure between a lower electrically conducting layer and a next upper electrically conducting layer with the material of said lower and next upper layers being selected from the group including metals and alloys, the process comprising:

forming electrically conductive first material on the integrated circuit structure in at least one location where the lower and the next upper layer are to be electrically connected, the first material being inert to etchants for the lower and the next upper layer, the area of contact between the lower and next upper layers being less than the area of the first material;

depositing the lower layer over first portions of the integrated circuit structure and over the first material;

depositing a dielectrical material over all of the lower layer and the first material;

etching the dielectric material over at least part of the first material using a process to which the first material is not as susceptible as the dielectric materials, and forming the next upper layer over second portions of the integrated circuit structure and in contact with the lower layer exposed by the step of etching dielectric material.

2. A process as set forth in claim 1, wherein the first material is one of the class of materials comprised of undoped polycrystalline silicon, doped polycrystalline silicon, refractory metals and refractory metal silicides.

3. A process as set forth in claim 1, wherein the step of removing insulating material is performed by chemically etching the insulating material.

4. A process as set forth in claim 3, wherein the insulating material is an oxide of silicon.

5. A process as set forth in claim 1, wherein the lower layer and the next upper layer comprise aluminum.

6. A process for multilevel metallization for allowing high density interconnects in bipolar, Schottky bipolar and MOS integrated circuits comprising:

providing a semiconductor wafer;

depositing on said wafer a layer of a material selected from the group including undoped polycrystalline silicon, doped polycrystalline silicon, refractory metal silicide, and refractory metal;

etching a pattern comprised of a number of pads of said material with the pads being at locations where the first and second layers of metal will make contact with each other through vias, the physical sizes of the pads being larger than the vias;

etching and opening contacts to the semiconductor substrate of the wafer;

depositing a metal suitable for ohmic and Schottky contact formation on sintering material of the wafer;

sintering the deposited metal to form contact material and etching the excess unreacted metal;

depositing a first layer of metal interconnect to material onto the wafer, the pads and the metal;

etching patterns in the first layer material;

depositing a dielectric layer on the first metal layer;

etching and open contacts through the dielectric layer to the first layer metal in alignment with the pads; and depositing second layer interconnect metal over the dielectric layer, whereby the first and second metal layers contact each other through said pads.

* * * * *